United States Patent [19]

Fujii et al.

[11] Patent Number: 5,003,126
[45] Date of Patent: Mar. 26, 1991

[54] SHIELDED FLAT CABLE

[75] Inventors: Yutaka Fujii; Taiji Oku; Haruo Saen, all of Tochigi, Japan

[73] Assignee: Sumitomo Electric Industries, Ltd., Osaka, Japan

[21] Appl. No.: 421,501

[22] Filed: Oct. 11, 1989

[30] Foreign Application Priority Data

Oct. 24, 1988 [JP] Japan .............. 63-137848[U]

[51] Int. Cl.⁵ .............................................. H01B 7/08
[52] U.S. Cl. .................................... 174/36; 174/115; 174/117 F; 174/117 FF
[58] Field of Search ................ 174/36, 115, 117 F, 174/117 FF

[56] References Cited

U.S. PATENT DOCUMENTS

| | | | |
|---|---|---|---|
| 3,576,723 | 4/1971 | Angele et al. ...................... | 174/36 |
| 3,612,743 | 10/1971 | Angele et al. ...................... | 174/36 |
| 3,634,782 | 1/1972 | Marshall ...................... | 174/117 F X |
| 3,775,552 | 11/1973 | Schumacher ...................... | 174/36 X |
| 4,209,215 | 6/1980 | Verma ...................... | 174/36 X |
| 4,283,593 | 8/1981 | Piasecki et al. .......... | 174/117 FF X |
| 4,468,089 | 8/1984 | Brorein ...................... | 174/36 X |
| 4,475,006 | 10/1984 | Olyphant, Jr. ...................... | 174/36 |
| 4,481,379 | 11/1984 | Bolick, Jr. et al. ...................... | 174/36 |
| 4,596,897 | 6/1986 | Gruhn ...................... | 174/36 |
| 4,616,102 | 10/1986 | Noorily ...................... | 174/36 |
| 4,616,717 | 10/1986 | Luetzow ...................... | 174/117 F |
| 4,707,671 | 11/1987 | Suzuki et al. ...................... | 174/36 X |
| 4,845,311 | 7/1989 | Schreiber et al. ...................... | 174/36 |

FOREIGN PATENT DOCUMENTS 2547152  4/1977  Fed. Rep. of Germany .

Primary Examiner—Morris H. Nimmo
Attorney, Agent, or Firm—Cushman, Darby & Cushman

[57]  ABSTRACT

A shielded flat transmission cable for use in wiring electronic appliances having consistent low resistance and a high shielding effect. The cable comprises a plurality of insulated parallel conductors including a grounding conductor and signal transmitting conductors. The conductors and insulating layer are surrounded by a thin metal shielding material. An insulating film surrounds the outer surface of the shielding material. The shielding material is directly and metallically connected to the grounding conductor providing a good electrical contact between the shielding material and the grounding conductor. The connecting means employed can be a spot weld or any other equivalent means directly connecting said grounding conductor and said shielding material. In a first embodiment of the invention the insulation layer, shielding material, and insulating film are formed through lamination. In a second embodiment of the invention they are formed through winding.

12 Claims, 2 Drawing Sheets

SHIELDED FLAT CABLE

BACKGROUND OF THE INVENTION

1. Field of the Invention

The present invention relates in general to a shielded flat cable used for signal transmission in wiring electronic appliances. More specifically, the invention relates to improving the electrical connection between a grounding conductor and a shielding layer of a flat cable to provide a consistent low resistance between the grounding conductor and shielding layer to improve shielding.

2. Description of the Related Art

Flat cables are becoming increasingly popular for use as interface transmission wires. More and more, flat cables are replacing the twisted wires and coaxial lines. Flat cables are, however, more highly susceptible to externally induced noise and interference than both twisted wires and coaxial lines. Therefore, flat cables generally have built in shielding layers.

A shielding layer is ineffective unless properly grounded. Grounding the shielding layer in a flat cable is typically accomplished by connecting it to a ground wire conductor built in the cable. The quality of shielding is directly related to the quality of the ground connection.

FIG. 1 (PRIOR ART) and FIG. 2 (PRIOR ART) are cross-sections of two connection arrangements used in standard flat cables. As shown in FIG. 1 (PRIOR ART), two flat conductors are stacked on each other to form a ground wire 2. One of the flat conductors is bent so as to be in physical contact with a shielding layer 1. Physical contact between the ground wire and shielding layer provides the electrical connection. FIG. 2 (PRIOR ART), is a schematic cross section of a second electrical connection arrangement of another typical flat cable. Ground wire 2 and transmission wires 3 are covered on their outside surfaces with an insulating material 4. The insulating material 4 is removed above the ground wire and replaced with a conductive adhesive agent 6. The adhesive agent 6 electrically connects the ground wire 2 to the shielding layer 1.

In the above-discussed flat cable arrangements, the resistance between the shielding layer and the ground wire is relatively high and variable; thus, the shielding effect is relatively poor and also variable. For example, in the shielded flat cable shown in FIG. 1, resistance between shielding layer and ground varies from 50 mΩ to 200 mΩ.

SUMMARY OF THE INVENTION

An object of the present invention is to provide a shielded flat cable providing a good connection between the shielding layer and the grounding conductor to provide a consistent low resistance therebetween to provide good shielding.

To attain the aforementioned object, the present invention provides a flat cable with a shielding material directly and metallically connected to a grounding conductor. The cable also contains a plurality of signal transmitting conductors. The conductors are separated and insulated from each other by an insulating material. The shielding material comprises a thin metal tape surrounding the insulating material and is connected directly to the grounding conductor through a spot weld or an equivalent means. An insulating film surrounds the outer surface of the shielding material.

BRIEF DESCRIPTION OF THE DRAWINGS

Preferred embodiment(s) of the invention will be described in detail with reference to the drawings wherein like reference numerals denote like or corresponding parts throughout.

DETAILED DESCRIPTION OF THE PREFERRED EMBODIMENTS

Figure 1:
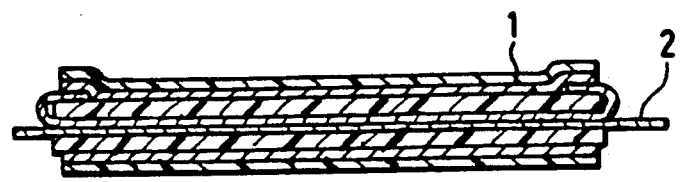
FIG. 1 (PRIOR ART) is a longitudinal cross section of a shielded flat cable in which a ground wire 2 is formed by stacking two flat-type conductors on each other while bending the top conductor to a position in physical contact with the shielding layer 1.
Figure 2:
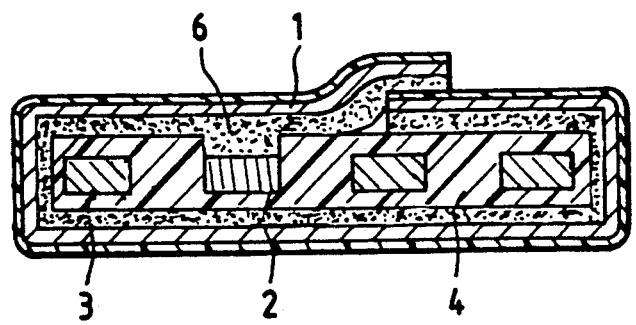
FIG. 2 (PRIOR ART) is a cross section of a shielded flat cable in which ground wire 2 is connected to shielding layer 1 through a conductive adhesive agent 6.
Figure 3:
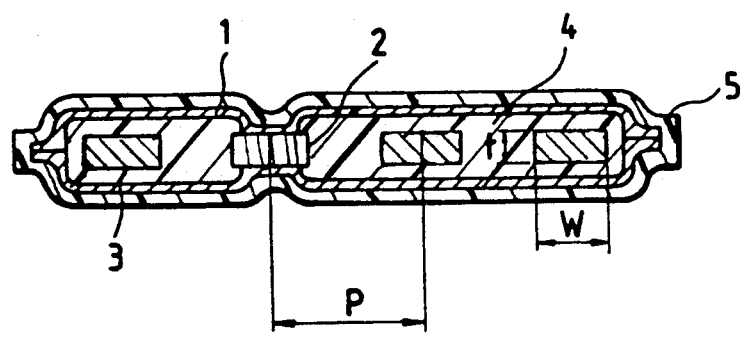
FIG. 3 is a cross-section of a first embodiment of a cable according to the present invention in which grounding conductor 2 is directly and metallically connected to shielding layer 1 which is laminated to insulation layer 4.

FIG. 3 is a cross-section of a first embodiment of a cable according to the present invention in which grounding conductor 2 is directly and metallically connected to shielding layer 1 which is laminated to insulation layer 4.

Shielding layer 1 is preferably made from an aluminum tape, but other appropriate materials could be used. The aluminum tape may have any desired thickness as long as the required shielding effect can be achieved. The aluminum tape generally has a thickness of approximately 10 micrometers. An adhesive layer may also be provided on the shielding layer if necessary. Copper or iron tape may be substituted alternatively for aluminum tape. Additionally, a thin layer of metal such as, for example, copper may be provided on the surface of the aluminum tape.

Reference numerals 2 and 3 designate a grounding conductor and signal transmitting conductor, respectively. These conductors are generally, but not limited to, flat type wires and made of copper, aluminum, copper or aluminum plated with silver or tin, or any alloy thereof. Tin plated, soft copper, flat-type conductors are preferred.

Insulation layer 4 constitutes a plastic insulator for coating the outer circumference of the conductors, including grounding conductor 2 and signal transmitting conductor 3, thereby holding the conductors in place. Insulation layer 4 may be formed by winding or laminating a plastic tape on the conductors or through an extrusion coating with a plastic material such as poly (vinyl chloride) or polyethylene. The plastic tape may be made of several materials including teflon or polyester. The shielding layer 1 mentioned above is laminated to an outer surface of the insulation layer 4.

An insulating film 5 covers the outer surface of the shielding layer 1. The insulating film 5 may comprise a plastic film or tape made of a material such as polyester or teflon and may be provided with an adhesive layer if necessary. The insulating film may also be formed by laminating or winding the plastic film or tape on the outer surface of the shielding layer.

The first embodiment of the present invention, shown in FIG. 3, utilizes spot welding to directly and metallically connect the grounding conductor 2 to the shielding layer 1. However, the connection of the shielding layer 1 to the grounding conductor 2 is not limited a spot weld. Any equivalent connecting arrangement can be used as long as the same effect can be obtained. In the FIG. 3 embodiment, there are four tin-plated, soft copper, flat-type conductors, each having a thickness (t) of 0.1 mm and a width (w) of 0.8 mm. These conductors include a grounding conductor 2 and signal transmitting conductor 3. An insulation layer 4 made of a polyester film with an adhesive layer surrounds and separates the conductors by a pitch width (P) of 1.25 mm.

A shielding layer 1 made of an aluminum tape with an adhesive layer having a thickness of 12 μm is laminated on the outer surface of the insulation layer 4. The upper and lower surfaces of the grounding conductor 2 are not covered by the insulation layer 4. This enables the shielding layer 1 to be in direct contact with the grounding conductor 2 on these surfaces. The shielding layer 1 and the grounding conductor 2 are directly connected at these surfaces through spot welding.

An insulating film 5 made of a polyester film having a thickness of 7 mm protects and surrounds the shielding layer on its outer surface. The insulating film 5 has an adhesive layer and is laminated on the shielding layer 1.

In a test of the FIG. 3 embodiment, ten measured resistances between the shielding layer and the grounding conductor were in the range of 10 mΩ to 20 mΩ. These resistance values are much lower and more stable than those of conventional shielded flat cables.

Figure 4:
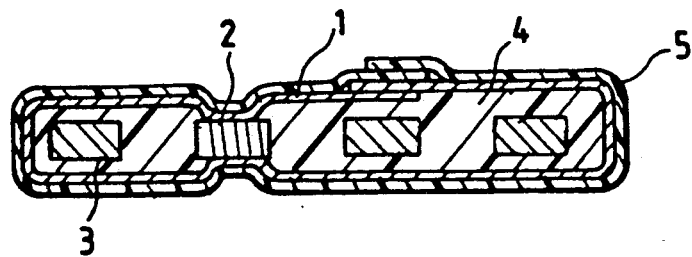
FIG. 4 is a cross-section of a second embodiment of a cable according to the present invention in which grounding conductor 2 is directly and metallically connected to shielding layer 1 except that the shielding layer 1 is wound around insulation layer 4.

FIG. 4 is a cross-section of a second embodiment of a cable according to the present invention. In the FIG. 4 embodiment, grounding conductor 2 is directly and metallically connected to shielding layer 1 except that the shielding layer is wound around insulation layer 4. Shielding layer 1 and insulating film 4 are wound about the insulation layer 4 instead of being laminated. The shielding layer 1 and the grounding conductor are similarly directly and metallically connected through welding. This variation produces a similar low and consistent resistance value to the embodiment shown in FIG. 3.

Figure 5:
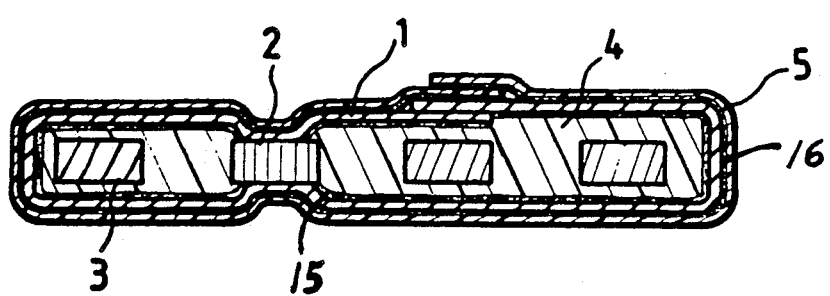
FIG. 5 is a cross-section of an embodiment where adhesive layers are shown.

FIG. 5 shows an embodiment where adhesive layers 15 and 16 between the insulation layer 4 and shielding layer 1 and the shielding layer 1 and insulating film 5, respectively, are shown.

While this invention has been described in connection with what is presently considered to be the two most practical and preferred embodiments, it is to be understood that the invention is not limited to the disclosed embodiment, but, on the contrary, is intended to cover various modifications and equivalent arrangements included within the spirit and scope of the appended claims.

What is claimed is:

1. A flat transmission cable comprising:
   a plurality of separate parallel conductors including a grounding conductor and at least one signal transmitting conductor,
   an insulation layer covering the outer circumference of said at least one signal transmitting conductor and separating each parallel conductor,
   electrically conductive shielding material, surrounding said insulation layer, and said plurality of separate parallel conductors within said insulation layer, for shielding externally induced noise and interference said grounding conductor and said electrically conductive shielding material having no insulation layer therebetween on at least two sides of said grounding conductor such that said grounding conductor and said electrically conductive shielding material are in direct continuous longitudinal contact with each other on at least two sides of said grounding conductor;
   insulating film surrounding the outer circumference of said shielding material; and
   connecting means for joining said grounding conductor directly and metallically to said shielding material on at least two sides of said grounding conductor.

2. A flat transmission cable as recited in claim 1 wherein said conductors are flat type conductive wires.

3. A flat transmission cable as recited in claim 1 wherein said insulation layer comprises an insulating material laminated on the outer circumference of said conductors.

4. A flat transmission cable as recited in claim 1 wherein said insulation layer comprises an insulating material wound on the circumferences of the conductors.

5. A flat transmission cable as recited in claim 1 further comprising an adhesive layer formed on the inner surface of said shielding material.

6. A flat transmission cable as recited in claim 1 wherein said shielding material is laminated on the outer circumference of said insulation layer.

7. A flat transmission cable as recited in claim 1 wherein said shielding material comprises a thin metal tape.

8. A flat transmission cable as recited in claim 1 wherein said shielding material is wound on the outer circumference of said insulation layer.

9. A flat transmission cable as recited in claim 1 wherein said insulating film is laminated on the outer circumference of said shielding material.

10. A flat transmission cable as recited in claim 1 further comprising an adhesive layer formed on the inner surface of said insulating film.

11. A flat transmission cable as recited in claim 1 wherein said insulating film is wound on the outer circumference of said shielding means.

12. A flat transmission cable as recited in claim 1 wherein said connecting means comprises a spot weld joining said grounding conductor with said shielding material.

* * * * *